United States Patent
Park

(10) Patent No.: US 7,729,152 B2
(45) Date of Patent: Jun. 1, 2010

(54) PIN CONFIGURATION CHANGING CIRCUIT, BASE CHIP AND SYSTEM IN PACKAGE INCLUDING THE SAME

(75) Inventor: Jin-Kwon Park, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 327 days.

(21) Appl. No.: 12/005,258

(22) Filed: Dec. 26, 2007

(65) Prior Publication Data
US 2008/0212351 A1 Sep. 4, 2008

(30) Foreign Application Priority Data

Jan. 25, 2007 (KR) .................. 10-2007-0007684

(51) Int. Cl.
*G11C 5/02* (2006.01)
(52) U.S. Cl. .................. 365/51; 365/63; 365/231
(58) Field of Classification Search .......... 365/51, 365/63, 231
See application file for complete search history.

(56) References Cited

U.S. PATENT DOCUMENTS

| | | | | |
|---|---|---|---|---|
| 5,835,395 A | * | 11/1998 | Schreck et al. | 365/51 |
| 6,160,718 A | * | 12/2000 | Vakilian | 361/803 |
| 6,317,377 B1 | | 11/2001 | Kobayashi | |
| 6,632,705 B1 | * | 10/2003 | Kang et al. | 438/107 |
| 6,876,562 B2 | * | 4/2005 | Johnson et al. | 365/63 |
| 6,885,572 B2 | | 4/2005 | Fujisawa | |
| 2003/0223262 A1 | | 12/2003 | Fujisawa | |
| 2006/0192282 A1 | | 8/2006 | Suwa et al. | |
| 2006/0245228 A1 | * | 11/2006 | Mahajan et al. | 365/51 |

FOREIGN PATENT DOCUMENTS

| | | |
|---|---|---|
| JP | 2000-298981 | 10/2000 |
| JP | 2004-005856 | 1/2004 |
| KR | 10-2006-0094917 A | 8/2006 |

\* cited by examiner

*Primary Examiner*—Connie C Yoha
(74) *Attorney, Agent, or Firm*—Mills & Onello, LLP

(57) ABSTRACT

A pin configuration changing circuit of a base chip includes pin configuration changing register (PCCR) and a pin configuration changing logic unit (PCCLU). The PCCR stores and provides a pin connection assignment value indicating a first connection order of a plurality of pins included in a memory connected to the base chip, based on a type of the memory when the memory is changed. The PCCLU receives the pin connection assignment value and changes a second connection order of a plurality of inner pins of the base chip. Various memories can be connected to the base chip without extra wiring or a printed circuit board (PCB).

18 Claims, 5 Drawing Sheets

PIN CONFIGURATION CHANGING CIRCUIT, BASE CHIP AND SYSTEM IN PACKAGE INCLUDING THE SAME

CROSS-REFERENCE TO RELATED APPLICATIONS

This application claims priority under 35 USC §119 to Korean Patent Application No. 10-2007-0007684, filed on Jan. 25, 2007 in the Korean Intellectual Property Office (KIPO), the disclosure of which is incorporated herein in its entirety by reference.

BACKGROUND OF THE INVENTION

1. Field of the Invention

The present invention relates to a pin configuration, and more particularly to a pin configuration changing circuit, a base chip and a system in package including a pin configuration changing circuit.

2. Description of the Related Art

A system in package (SIP) is related to a technology where two independent chips at the wafer level are integrated into a single package, thus the SIP can have merits in view of cost and size.

In the conventional SIP, various memories having different sizes can be connected to a base chip. When the various memories having different sizes are connected to the base chip, the various memories have different pin arrangements according to the memory size. Therefore, when the base chip supports a memory interface by using a fixed pin arrangement, a particular kind of a memory can be connected to the base chip without extra effort. However, when a different kind of a memory, which has a pin arrangement different from the supported kind of the memory, is connected to the base chip, the base chip has to include complicated wiring. Therefore, a size of a printed circuit board for the SIP is increased, and thus the cost of the SIP is increased.

SUMMARY OF THE INVENTION

In accordance with some aspects of the present invention, there is provided a pin configuration changing circuit (PCCC), which can change a connection order of a plurality of inner pins of the base chip when a memory connected to the base chip is changed.

In accordance with other aspects of the present invention, there is provided a base chip including the PCCC.

In accordance with other aspects of the present invention, there is provided a SIP including the base chip.

In accordance with still other aspects of the present invention, there is provided a method of changing a pin configuration of a base chip.

In accordance with one aspect of the present invention, provided is a PCCC of a base chip. The PCCC includes a pin configuration changing register (PCCR) and a pin configuration changing logic unit (PCCLU). The PCCR is configured to determine a memory type of a memory and to store and provide a pin connection assignment value indicating a first connection order of a plurality of pins included in the memory when connected to the base chip in place of another memory that was previously connected to the base chip, based on the type of the memory. The PCCLU is configured to receive the pin connection assignment value and to change a second connection order of a plurality of inner pins of the base chip.

The pin connection assignment value can be determined based on a required access speed of the memory with respect to the inner pins.

The PCCLU can include at least one selecting unit configured to group the inner pins based on the required access speed of the memory with respect to the inner pins.

The at least one selecting unit can include at least one multiplexer configured to connect the inner pins to corresponding pins of the memory, based on the pin connection assignment value when the memory is changed.

The at least one selecting unit can include a plurality of selecting units and is configured to group of the inner pins that have different speeds, according to the corresponding selecting unit.

In accordance with another aspect of the present invention, provided is a base chip that includes a PCCC, a pad unit, and a plurality of outer pins. The PCCC is configured to change a first connection order of a plurality of inner pins of the base chip when a memory connected to the base chip is changed. The inner pins are connected to a plurality of pins included in the memory. The pad unit is coupled to the PCCC. The plurality of outer pins is coupled to the pad unit and is directly coupled to the memory that is changed.

The PCCC can include a PCCR configured to store and provide a pin connection assignment value indicating a second connection order of the pins included in the memory, and a PCCLU configured to receive the pin connection assignment value and to change the first connection order of the inner pins of the base chip.

The pin connection assignment value can be determined based on a required access speed of the memory with respect to the inner pins.

The pin configuration change logic unit can include at least one selecting unit configured to group the inner pins based on the required access speed of the memory with respect to the inner pins.

The at least one selecting unit can include at least one multiplexer configured to connect the inner pins to corresponding pins of the memory, based on the pin connection assignment value when the memory is changed.

The at least one selecting unit can include a plurality of selecting units configured to group inner pins that have different speeds according to the corresponding selecting unit.

In accordance with another aspect of the present invention, provided is a SIP that includes a base chip mounted on a package substrate and a memory, connected to the base chip, which includes a plurality of pins. The base chip includes a PCCC, a pad unit, and a plurality of outer pins. The PCCC is configured to change a first connection order of a plurality of inner pins of the base chip when the memory is changed, the plurality of inner pins being connected to the plurality of pins included in the memory. The pad unit is coupled to the PCCC. The plurality of outer pins are coupled to the pad unit and directly coupled to the memory that is changed.

The plurality of pins included in the memory can be arranged in substantially similar order when the memory is changed.

The pin configuration changing circuit can comprise a pin configuration changing register configured to store and provide a pin connection assignment value indicating a second connection order of the pins included in the memory; and a pin configuration changing logic unit configured to receive the pin connection assignment value and to change the first connection order of the inner pins of the base chip.

The pin connection assignment value can be determined based on a required access speed of the memory with respect to the inner pins.

The pin configuration change logic unit can include at least one selecting unit configured to group the inner pins based on the required access speed of the memory with respect to the inner pins.

The at least one selecting unit can include at least one multiplexer configured to connect the inner pins to corresponding pins of the memory, based on the pin connection assignment value when the memory is changed.

The at least one selecting unit can include a plurality of selecting units configured to group the inner pins that have different speeds according to the corresponding selecting unit.

In accordance with another aspect of the present invention, in a method of changing a pin configuration of the base chip mounted on a SIP, a pin connection assignment value is stored and provided, based on a type of a memory when the memory connected to the base chip is changed. A first connection order of a plurality of pins included in the memory connected to the base chip can be determined by the pin connection assignment value. A second connection order of a plurality of inner pins of the base chip is changed by receiving the pin connection assignment value. The plurality of inner pins of the base chip is connected to the plurality of the pins of the memory.

In some embodiment, the pin connection assignment value can be determined based on a required access speed of the memory with respect to the inner pins. The inner pins can be grouped into at least one group based on the access speed.

Therefore, a connection order of a plurality of inner pins of the base chip can be changed according to a memory without extra wiring or a printed circuit board (PCB).

DESCRIPTION OF THE EMBODIMENTS

Figure 1A:
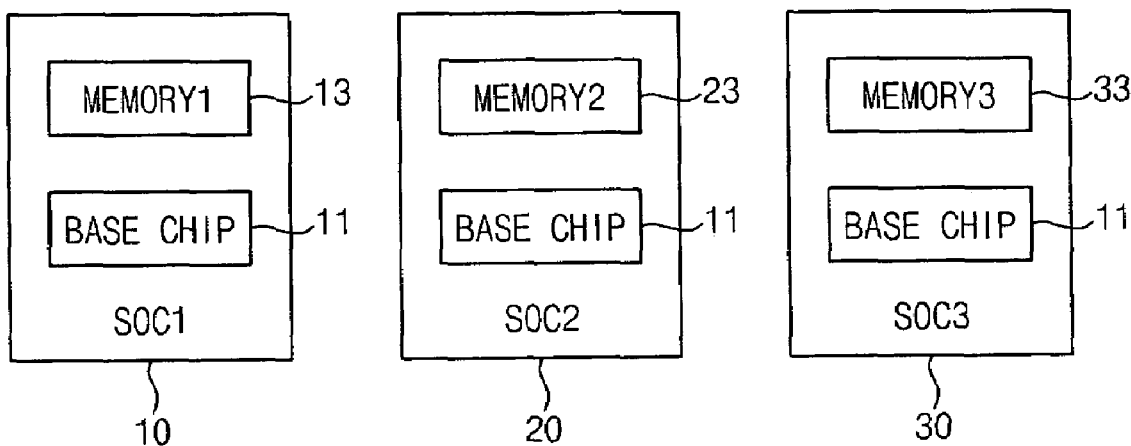
FIG. 1A are a block diagram illustrating an embodiment of system on chips (SoCs) including various memories and FIG. 1B illustrates embodiments of pin configurations of the memories.

Embodiments in accordance with the present invention now will be described with reference to the accompanying drawings. The present invention can, however, be embodied in many different forms and should not be construed as limited to the embodiments set forth herein. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, operations, elements, and/or components, but do not preclude the presence or addition of one or more other features, integers, steps, operations, elements, components, and/or groups thereof.

Figure 1B:
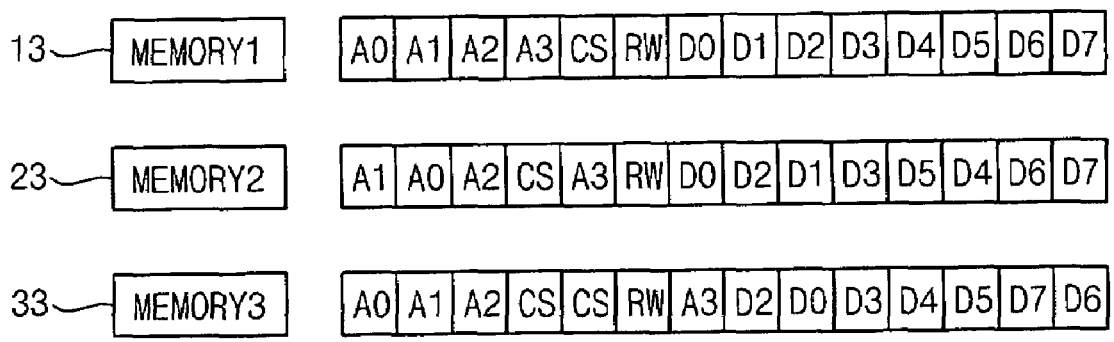

FIG. 1A is a block diagram illustrating embodiments of system on chips (SoCs) including various memories and FIG. 1B illustrates pin configurations of the memories.

Figure 2:
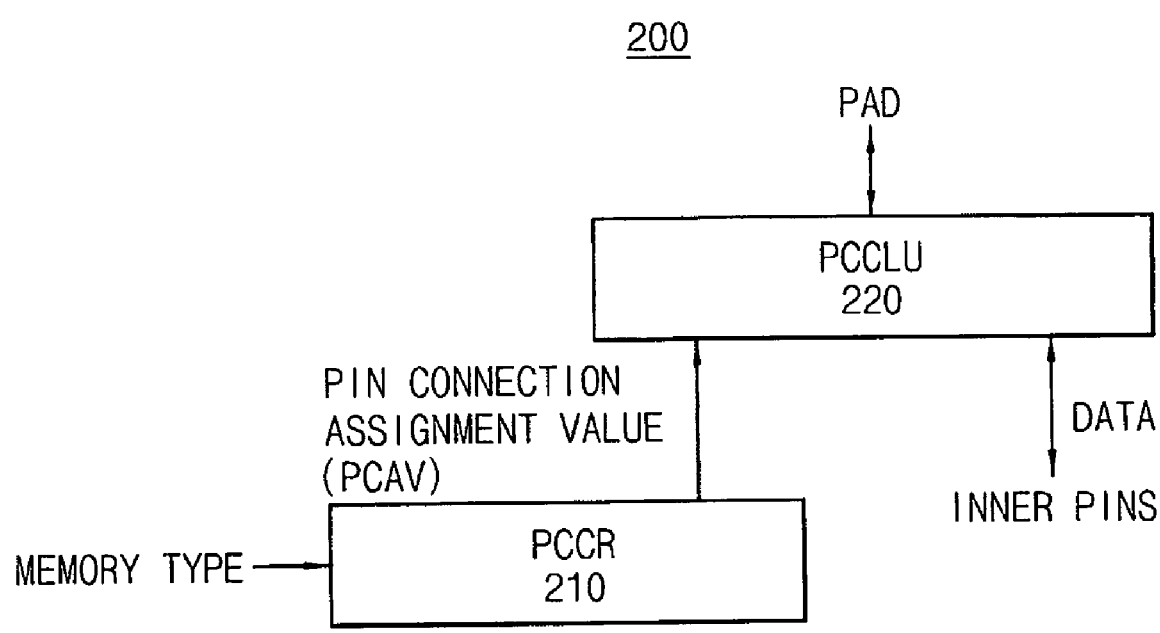
FIG. 2 is a block diagram illustrating an embodiment of a PCCC of a base chip mounted on a system in package according to an aspect of the present invention.

FIG. 2 is a block diagram illustrating an embodiment of a pin configuration changing circuit (PCCC) 200 of a base chip mounted on a system in package (SIP), according to an aspect of the present invention.

Referring to the embodiments of FIGS. 1A, 1B and 2, there will be a description of the PCCC 200 according to an aspect of the present invention.

Referring to FIG. 1A, a first SoC 10 includes a base chip 11 and a first memory 13. The second SoC includes the base chip 11 and a second memory 23. The third SoC includes the base chip 11 and a third memory 33. In FIG. 1A, the first, second and third SoCs include the same base chip 11, even though the first, second and third memories 13, 23 and 33 have chip configurations different from one another.

As illustrated in FIG. 1B, the first, second, and third memories 13, 23, and 33 connected to the base chip 11 can have similar pin arrangement orders. In FIG. 1B, A0 to A3 pins correspond to address pins, CS and RW pins correspond to command pins, and D0 to D7 pins correspond to data pins. The pins of the first, second, and third memories 13, 23, and 33 can be accessed by a memory controller (not illustrated) or other devices at different access speeds. Although the pins have different access speeds, the pins can be grouped based on the access speed.

Hereinafter, it is assumed that the A0 and Ai pins are required to be accessed at a relatively fast speed, the A2, A3, CS and RE pins are required to be accessed at a normal speed, and the D0 to D7 pins are required to be accessed at a relatively slow speed.

Referring to FIG. 2, the PCCC 200 includes a pin configuration changing register (PCCR) 210 and a pin configuration changing logic unit (PCCLU) 220.

When the memory having a plurality of pins for a connection to the base chip 11 is changed, the PCCR 210 stores a pin connection assignment value that determines a first connection order of the pins included in the memory, based on a type of the memory that is connected to the base chip. The pin connection assignment value can be determined based on a required access speed of the memory connected to the base chip 11 with respect to a plurality of inner pins of the base chip 11. The pin connection assignment value can be stored automatically in the PCCR 210 according to the memory type that is changed. Alternatively, information of the pin connection assignment value can be previously stored in the PCCR 210 according to the memory type that is changed. The PCCLU 220 receives the pin connection assignment value and changes a second connection order of the inner pins coupled to the pins included in the memory.

Figure 3:
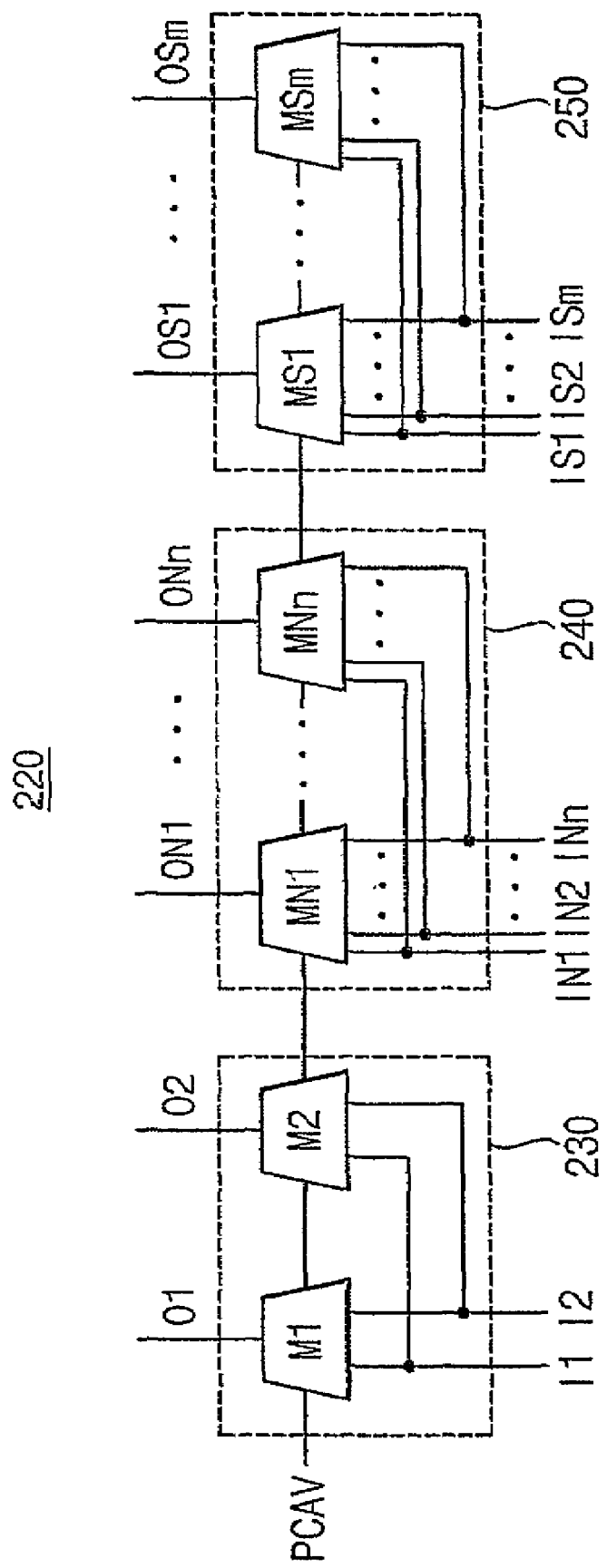
FIG. 3 is a block diagram illustrating an embodiment of a PCCLU in the PCCC of FIG. 2.

FIG. 3 is a block diagram illustrating a PCCLU 220 in the PCCC of FIG. 2.

Referring to FIG. 3, the PCCLU 220 includes at least one selecting unit, for example, first, second, and third selecting units 230, 240 and 250, that groups the inner pins based on the required access speed. Each of the first, second, and third selecting units 230, 240 and 250 can include at least one multiplexer that connects the inner pins to corresponding pins of the memory. In an example embodiment, the first selecting unit 230 includes two multiplexers M1 and M2. The second selecting unit 240 includes N multiplexers MN1, ..., MNn. The third selecting unit 250 includes M multiplexers MS1, ..., MSm.

For convenience of description, it is assumed that N is 4, and M is 8 in FIG. 3. When the first memory 13 is connected to the base chip 11 in FIGS. 1A and 1B, an inner pin 11 is required to be connected to A0 pin of the first memory 13, an inner pin 12 is required to be connected to pin A1 of the first memory 13, inner pins IN1, IN2, IN3 and IN4 are required to be respectively connected to pins A2, A3, CS and RW of the first memory 13, and inner pins IS1 to IS8 are required to be respectively connected to pins D0 to D7 of the first memory 13. In this case, a pad O1 is connected to pin A0 of the first memory 13, a pad O2 is connected to pin A1 of the first memory 13, pads ON1, ON2, ON3 and ON4 are respectively connected to pins A2, A3, CS and RW of the first memory 13, and pads OS1 to OS8 are respectively connected to pins D0 to D7 of the first memory 13.

When a memory connected to the base chip 11 is changed from the first memory 13 to the second memory 23, pins of the second memory 23 are respectively connected to corresponding pads O1 to O2, ON1 to ON4, and pads OS1 to OS8 according to an order of the pins of the second memory 23 as illustrated in FIG. 1B. However, the first selecting unit 230 connects the inner pin 11 to the pad O2, and connects the inner pin 12 to the pad O1 according to the pin connection assignment value that is determined based on a type of the second memory 23. Similarly, the second selecting unit 240 connects the inner pin IN1 to the pad ON1, connects the inner pin IN2 to the pad ON3, connects the inner pin IN3 to the pad ON2, and connects the inner pin IN4 to the pad ON4 according to the pin connection assignment value that is determined based on the type of the second memory 23. Similarly, the third selecting unit 250 connects the inner pin IS1 to the pad OS1, connects the inner pin IS2 to the pad OS3, connects the inner pin IS3 to the pad OS2, connects the inner pin IS4 to the pad OS4, connects the inner pin IS5 to the pad OS6, connects the inner pin IS6 to the pad OS5, connects the inner pin IS7 to the pad OS7, and connects the inner pin IS8 to the pad OS8 according to the pin connection assignment value that is determined based on the type of the second memory 23.

When the third memory 33 is connected to the base chip 11 instead of the second chip 23, the inner pins of the base chip 11 are respectively connected to corresponding pins of the third memory 33 according to the pin connection assignment value that is determined based on the type of the third memory 33. That is, when a memory connected to the base chip 11 is changed, the inner pins of the base chip 11 are respectively connected to the corresponding pins of the memory that is changed by operation of the selecting units 230, 240, and 250 without extra wiring or a printed circuit board (PCB).

In FIG. 3, the inner pins 11 and 12 are required to be accessed at high speed, and it is desirable that there is no extra logic between the inner pins 11 and 12 and outer pins of the base chip if possible. Other inner pins IN1 to INn and IS1 to ISm are grouped into a normal group including the inner pins IN1 to INn and a slow group including the inner pins IS1 to ISm, based on an access speed according to a level at which an extra logic is required between the inner pins and outer pins.

After inner pins are grouped based on the access speed, the inner pins 11 and 12 are respectively connected to the pads O1 and O2 according to the pin connection assignment value based on the type of a memory connected to the base chip 11. Similarly, the inner pins IN1 to INn are connected to the corresponding pads ON1 to ONn, and the inner pins IS1 to ISm are connected to the corresponding pads OS1 to OSm.

Therefore, different memories and a base chip can be packaged in a system without extra wiring or a PCB by employing the PCCC according to aspects of the present invention, as shown in the example embodiment.

Figure 4:
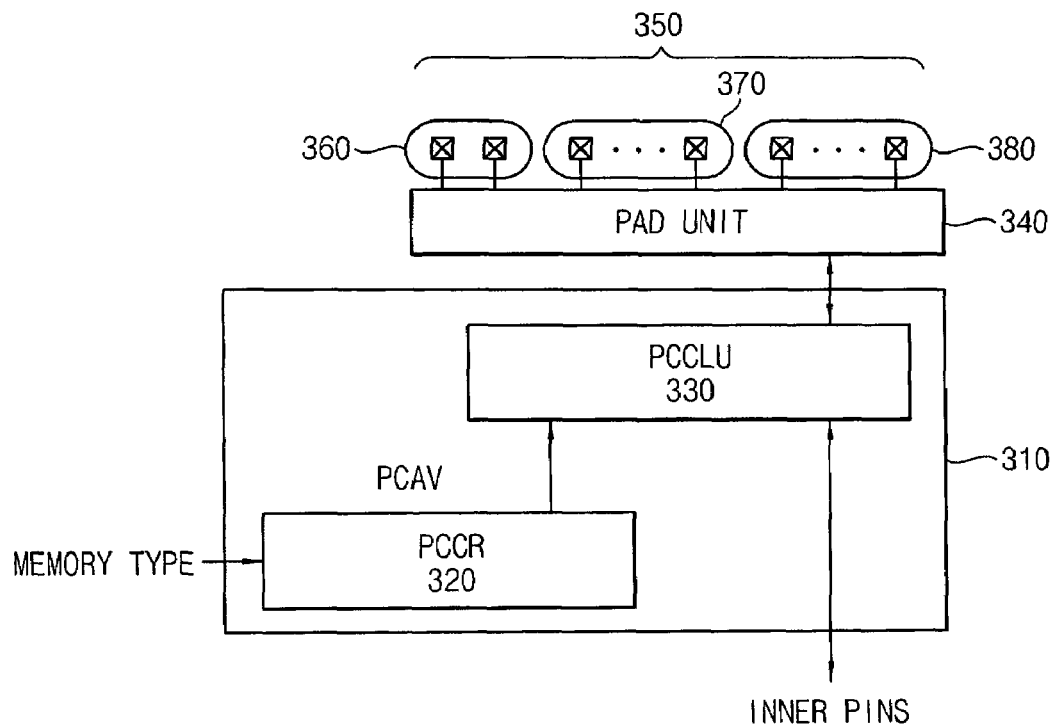
FIG. 4 is a block diagram illustrating an embodiment of a base chip according to an aspect of the present invention.

FIG. 4 is a block diagram illustrating an embodiment of a base chip 300 according to an aspect of the present invention.

Referring to FIG. 4, the base chip 300 includes a PCCC 310 and a pad unit 340 and a plurality of outer pins 350.

The PCCC 310 includes a PCCR 320 and a PCCLU 330. Architecture and operation of the PCCR 320 and the PCCLU 330 are similar to architecture and operation of the PCCR 210 and the PCCLU 220 in FIG. 2 and FIG. 3, and thus repeated description will be omitted. The pad unit 340 connects the PCCLU 330 to the plurality of outer pins 350 that are directly connected to a memory that can be changed.

The outer pins 350 are directly connected to the memory. The outer pins 350 are grouped into high speed pins 360, normal speed pins 370, and low speed pins 380. The high speed pins 360 can be connected to pins of the memory which has a high access speed. The normal speed pins 370 can be connected to pins of the memory which have a normal access speed. The slow speed pins 380 can be connected to pins of the memory which have a slow access speed.

When a memory that is connected to the outer pins 350 is changed, a connection order of the internal pins of the base chip is changed according to access speed by employing the PCCC 310. Therefore the base chip can be packaged in a system without extra wiring or a PCB even though a memory connected to the base chip is changed.

Figure 5:
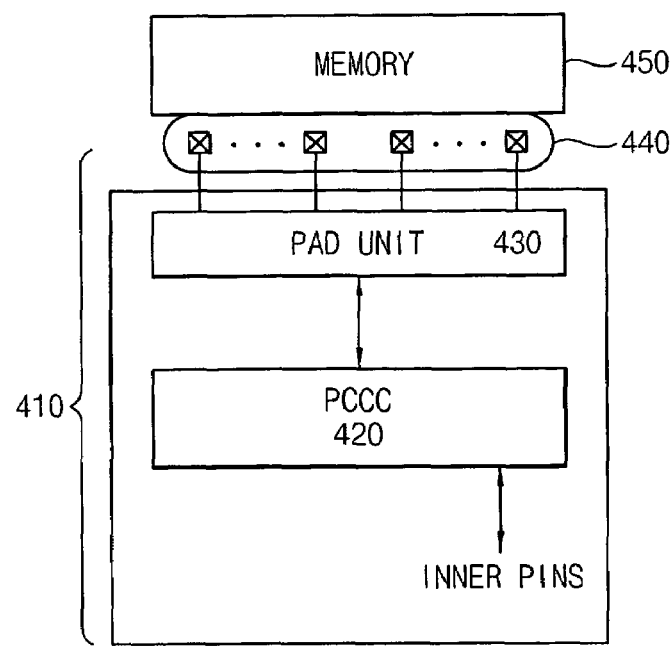
FIG. 5 is a block diagram illustrating an embodiment of a system in package (SIP) according to aspects of the present invention.

FIG. 5 is a block diagram illustrating an embodiment of a system in package (SIP) 400 according to example embodiment of the present invention.

Referring to FIG. 5, the SIP 400 includes a base chip 410 mounted on a package substrate, and a memory 450 connected to the base chip 410. The base chip 410 includes a PCCC 420, a pad unit 430, and a plurality of outer pins 440.

The PCCC 420 included in the base chip 410 is configured to change a connection order of a plurality of inner pins of the base chip 410 according to a type of the memory 450 that is connected to the base chip 410. Architecture and operation of the PCCC 410 is similar to architecture and operation of the PCCC 200 in FIG. 2 and FIG. 3, and thus repeated description will be omitted. The SIP according to an example embodiment can change a connection order of a plurality of inner pins according to access speed by employing the PCCC, and thus can be packaged in a system without extra wiring or a PCB.

Figure 6:
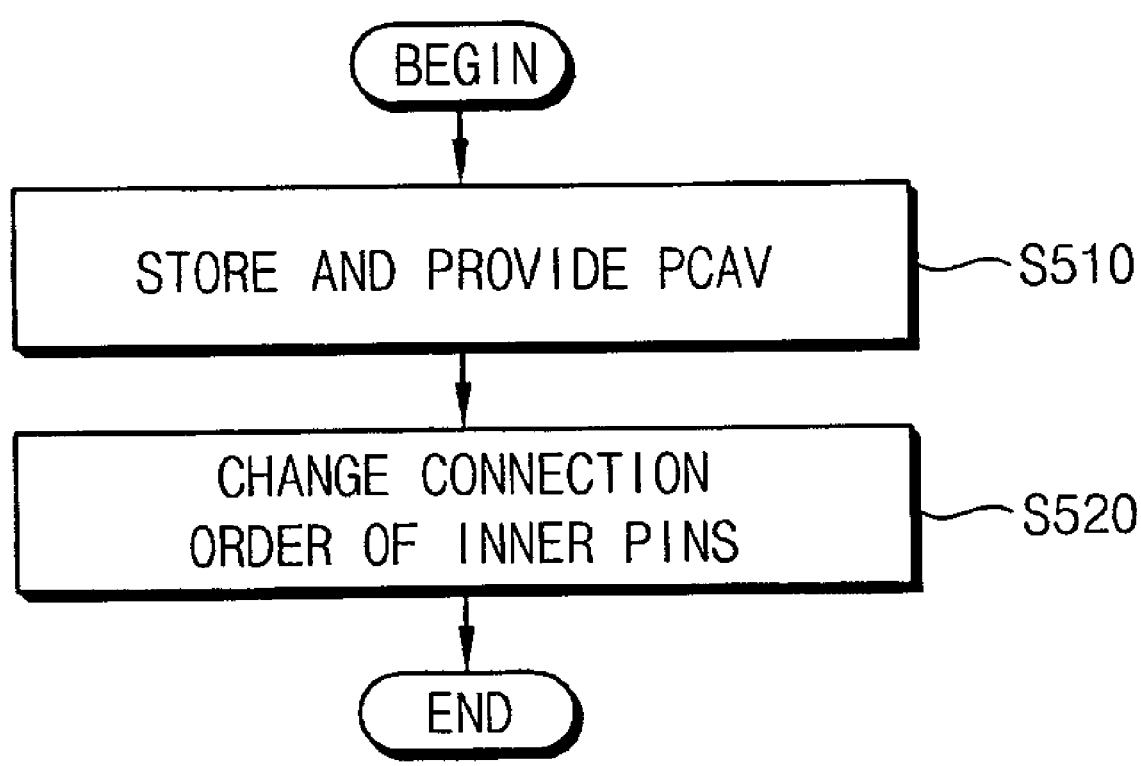
FIG. 6 is a flow chart illustrating an embodiment of a method of changing a pin configuration of a base chip mounted on a SIP according to an aspect of the present invention.

FIG. 6 is a flow chart illustrating an embodiment of a method of changing a pin configuration of a base chip mounted on a SIP according to an aspect of the present invention.

Referring to FIG. 6, a pin connection assignment value based on a type of a memory is stored and provided (step S510) when the memory connected to the base chip is changed. A first connection order of a plurality of pins included in the memory connected to the base chip can be determined by the pin connection assignment value. A second connection order of a plurality of inner pins of the base chip is changed (step S520) by receiving the pin connection assignment value. The plurality of inner pins of the base chip is connected to the plurality of the pins of the memory. In step S510, the pin connection assignment value can be determined based on a required access speed of the memory with respect to the inner pins. In step S520, the inner pins can be grouped into at least one group based on the access speed.

Detailed description of the method of changing the pin configuration is similar to the description of the PCCC in FIGS. 2 and 3, and thus will be omitted.

As mentioned above, a PCCC according to aspects of the present invention can change a connection order of a plurality of inner pins of a base chip according to a plurality of pins of a memory that is connected to the base chip, and thus a system can be packaged without extra wiring or a PCB.

While the example embodiments in accordance with aspects of the present invention and their advantages have been described in detail, it should be understood that various changes, substitutions and alterations can be made herein without departing from the scope of the invention. The invention, therefore, is to be defined by the broadest possible interpretation of the claims, and equivalents thereof.

What is claimed is:

1. A pin configuration changing circuit of a base chip, the pin configuration change circuit comprising:
   a pin configuration changing register configured to determine a memory type of a memory and to store and provide a pin connection assignment value indicating a first connection order of a plurality of pins included in the memory when connected to the base chip in place of another memory that was previously connected to the base chip, based on the type of the memory; and
   a pin configuration changing logic unit configured to receive the pin connection assignment value and to change a second connection order of a plurality of inner pins of the base chip.

2. The pin configuration changing circuit of claim 1, wherein the pin connection assignment value is determined based on a required access speed of the memory with respect to the inner pins.

3. The pin configuration changing circuit of claim 2, wherein the pin configuration changing logic unit includes at least one selecting unit configured to group the inner pins based on the required access speed of the memory with respect to the inner pins.

4. The pin configuration changing circuit of claim 3, wherein the at least one selecting unit includes at least one multiplexer configured to connect the inner pins to corresponding pins of the memory, based on the pin connection assignment value when the memory is changed.

5. The pin configuration changing circuit of claim 4, wherein the at least one selecting unit includes a plurality of selecting units and is configured to group inner pins that have different speeds, according to the corresponding selecting unit.

6. A base chip comprising:
   a pin configuration changing circuit configured to change a first connection order of a plurality of inner pins of the base chip when a memory connected to the base chip is changed, the plurality of inner pins being connected to a plurality of pins included in the memory;
   a pad unit coupled to the pin configuration change circuit; and
   a plurality of outer pins coupled to the pad unit and directly coupled to the memory that is changed.

7. The base chip of claim 6, wherein the pin configuration changing circuit comprises:
   a pin configuration changing register configured to store and provide a pin connection assignment value indicating a second connection order of the pins included in the memory; and
   a pin configuration changing logic unit configured to receive the pin connection assignment value and to change the first connection order of the inner pins of the base chip.

8. The base chip of claim 7, wherein the pin connection assignment value is determined based on a required access speed of the memory with respect to the inner pins.

9. The base chip of claim 8, wherein the pin configuration change logic unit includes at least one selecting unit configured to group the inner pins based on the required access speed of the memory with respect to the inner pins.

10. The base chip of claim 9, wherein the at least one selecting unit includes at least one multiplexer configured to connect the inner pins to corresponding pins of the memory, based on the pin connection assignment value when the memory is changed.

11. The base chip of claim 9, wherein the at least one selecting unit includes a plurality of selecting units configured to group inner pins that have different speeds according to the corresponding selecting unit.

12. A system in package (SIP) comprising:
    a memory including a plurality of pins; and
    a base chip mounted on a package substrate, the memory being connected to the base chip, the base chip comprising:
       a pin configuration changing circuit configured to change a first connection order of a plurality of inner pins of the base chip when the memory is changed, the plurality of inner pins being connected to the plurality of pins included in the memory;
       a pad unit coupled to the pin configuration change circuit; and
       a plurality of outer pins coupled to the pad unit and directly coupled to the memory that is changed.

13. The SIP of claim 12, wherein the plurality of pins included in the memory is arranged in a substantially similar order when the memory is changed.

14. The SIP of claim 13, wherein the pin configuration changing circuit comprises:
    a pin configuration changing register configured to store and provide a pin connection assignment value indicating a second connection order of the pins included in the memory; and
    a pin configuration changing logic unit configured to receive the pin connection assignment value and to change the first connection order of the inner pins of the base chip.

15. The SIP of claim 14, wherein the pin connection assignment value is determined based on a required access speed of the memory with respect to the inner pins.

16. The SIP of claim 15, wherein the pin configuration change logic unit includes at least one selecting unit configured to group the inner pins based on the required access speed of the memory with respect to the inner pins.

17. The SIP of claim 16, wherein the at least one selecting unit includes at least one multiplexer configured to connect the inner pins to corresponding pins of the memory, based on the pin connection assignment value when the memory is changed.

18. The SIP of claim 16, wherein the at least one selecting unit includes a plurality of selecting units configured to group the inner pins that have different speeds according to the corresponding selecting unit.

* * * * *